United States Patent
Wang et al.

(10) Patent No.: US 6,421,812 B1
(45) Date of Patent: Jul. 16, 2002

(54) PROGRAMMING MODE SELECTION WITH JTAG CIRCUITS

(75) Inventors: Xiaobao Wang, Santa Clara; Chiakang Sung, Milpitas; Joseph Huang, San Jose; Bonnie Wang, Cupertino; Khai Nguyen, San Jose; Richard G. Cliff, Milpitas, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/094,186

(22) Filed: Jun. 9, 1998

Related U.S. Application Data (60) Provisional application No. 60/049,478, filed on Jun. 13, 1997, provisional application No. 60/050,953, filed on Jun. 13, 1997, provisional application No. 60/049,275, filed on Jun. 10, 1997, provisional application No. 60/049,246, filed on Jun. 10, 1997, provisional application No. 60/052,990, filed on Jun. 10, 1997, provisional application No. 60/049,247, filed on Jun. 10, 1997, provisional application No. 60/049,243, filed on Jun. 10, 1997, and provisional application No. 60/049,245, filed on Jun. 10, 1997.

(51) Int. Cl.[7] .............................................. G06F 17/50
(52) U.S. Cl. ....................................................... 716/5
(58) Field of Search .................... 716/5; 711/5; 714/727

(56) References Cited

U.S. PATENT DOCUMENTS

| 3,761,695 A | 9/1973 | Eichelberger ......... 235/153 AC |
| 3,783,254 A | 1/1974 | Eichelberger ............... 235/152 |
| 3,806,891 A | 4/1974 | Eichelberger et al. ... 340/172.5 |
| 4,488,259 A | 12/1984 | Mercy ........................ 364/900 |
| 4,667,325 A | 5/1987 | Kitano et al. .................. 371/25 |
| 4,701,920 A | 10/1987 | Resnick et al. ................ 371/25 |
| 5,175,859 A | 12/1992 | Miller et al. ................. 395/800 |
| 5,336,951 A | 8/1994 | Josephson et al. .......... 307/465 |
| 5,355,369 A | 10/1994 | Greenbergerl et al. ..... 371/22.3 |

(List continued on next page.)

FOREIGN PATENT DOCUMENTS

| EP | 0 639 006 A1 | 2/1995 | |
| EP | 0 828 163 A1 | 3/1998 | |
| WO | WO 97/06599 | 2/1997 | ......... H03K/19/177 |

OTHER PUBLICATIONS

Altera Corporation, Data Sheet, "Flex 10K Embedded Programmable Logic Family," Jul., 1995, ver. 1, pp. 1–39.

(List continued on next page.)

*Primary Examiner*—Matthew Smith
*Assistant Examiner*—Leigh Garbowski
(74) *Attorney, Agent, or Firm*—Townsend and Townsend and Crew LLP (57) ABSTRACT

A technique to provide higher system performance by increasing amount of data that may be transferred in parallel is to increase the number of external pins available for the input and output of user data (user I/O). Specifically, a technique is to reduce the number of dedicated pins used for user I/O, leaving more external pins available for user I/O. The dedicated pins used to implement a function such as the JTAG boundary scan architecture may be also be used to provide other functionality, such as to select the programming modes. In a specific embodiment, a JTAG instruction code that is not already used for a JTAG boundary scan instruction stored in an instruction register (220) may be used to replace the programming mode select pins (252) in a programmable logic device (PLD).

29 Claims, 8 Drawing Sheets

U.S. PATENT DOCUMENTS

| | | | |
|---|---|---|---|
| 5,361,373 A | 11/1994 | Gilson | 395/800 |
| 5,489,858 A | 2/1996 | Pierce et al. | 326/56 |
| 5,491,666 A | 2/1996 | Sturges | 365/201 |
| 5,581,564 A | 12/1996 | Miller et al. | 371/22.3 |
| 5,590,305 A | 12/1996 | Terrill et al. | 395/430 |
| 5,594,367 A | 1/1997 | Trimberger et al. | 326/41 |
| 5,644,496 A | 7/1997 | Agrawal et al. | 364/489 |
| 5,650,734 A | 7/1997 | Chu et al. | 326/38 |
| 5,734,868 A | 3/1998 | Curd et al. | 395/500 |
| 5,737,567 A | 4/1998 | Whittaker et al. | 395/430 |
| 5,829,007 A * | 10/1998 | Wise et al. | 711/5 |
| 5,841,867 A | 11/1998 | Jacobson et al. | 380/25 |
| 5,869,979 A | 2/1999 | Bocchino | 326/38 |
| 5,991,908 A * | 11/1999 | Baxter et al. | 714/727 |
| 6,058,255 A * | 5/2000 | Jordan | 716/5 |

OTHER PUBLICATIONS

Altera Corporation, Data Sheet, "Flex 8000 Programmable Logic Device Family," Aug., 1994, ver. 4, pp. 1–22.

Altera Corporation, Data Sheet, "Max 7000 Programmable Logic Device Family," Jun. 1996, ver 4, pp. 193–261.

Altera Corporation, Application Note 39, "JTAG Boundary–ScanTesting In Altera Devices," Nov., 1995, ver. 3, pp. 1–28.

IEEE Computer Society, "IEEE Standard Test Access Port and Boundary–Scan Architecture (IEEE Std 1149.1–1990)," Institute of Electrical and Electronics Engineers, Inc., New York, NY, Oct. 21, 1993, pp. 1–1 to 12–6 and Appendix A–1 to A–12.

IEEE Computer Society, "Supplement to (IEEE Std 1149.1–1990), IEEE Standard Test Access Port and Boudary–Scan Architecture (IEEE Std 11493.1b–1994)," Institute of Electrical and Electronics Engineers, Inc., New York, NY, Mar. 1, 1995, pp. 1–67.

Xilnix Corporation, "The Programmable Logic Data Book," 1993, pp. 1–1 to 10–8.

Xilnix Corporation, "The Programmable Logic Data Book," Section 9, 1994, pp. 9–1 to 9–32.

Xilnix Corporation, "The Programmable Logic Data Book," Product Description, "XC2000 Logic Cell Array Families," Aug. 1994, pp. 2–187 to 2–216.

Xilnix Corporation, "The Programmable Logic Data Book," Product Description, "XC3000, XC3000A, XC000L, SC3100, XC3100A Logic Cell Array Families," pp. 2–105 to 2–152.

Xilnix Corporation, "The Programmable Logic Data Book," Product Specification, "XC4000 Series Field Programmable Gate Arrays," Jul. 30, 1996, version 1.03, pp. 4–5 to 4–76.

* cited by examiner

PROGRAMMING MODE SELECTION WITH JTAG CIRCUITS

This application claims the benefit of a U.S. provisional application No. 60/049,275, filed Jun. 10, 1997; No. 60/049,478, filed Jun. 13, 1997; No. 60/049,246, filed Jun. 10, 1997; No. 60/052,990, filed Jun. 10, 1997; No. 60/049,247, filed Jun. 10, 1997; No. 60/049,243, filed Jun. 10, 1997; No. 60/050,953, filed Jun. 13, 1997; and No. 60/049,245, filed Jun. 10, 1997, all of which are incorporated herein by reference.

BACKGROUND OF THE INVENTION

The present invention relates to the field of integrated circuits, and more specifically to techniques to effectively provide greater number of external pins for input and output of data.

Semiconductor technology continues to improve. This technology allows greater and greater functionality to be provided by a single integrated circuit or "chip." Signals are input to and output from the chip using external pins or pads. The chip interfaces to external circuitry, possibly on other chips, using the external pins.

The performance of a system depends in part on the amount or rate at which data can be transferred on and off the chip. This transfer rate may be referred to as the data bandwidth. One technique for increasing system performance is to provide more rapid transfer rates. This may be accomplished by improvements in process technology or circuit design. Another technique to increase system performance is to transfer a greater amount of data at one time (or "in parallel"). Therefore, for greater performance, it is important there are many external pins available for input and output of user data.

In an integrated circuit, certain pins are sometimes dedicated to functions other than user data I/O. For example, in a programmable integrated circuit such as a PLD or FPGA, some pins may be dedicated to the programming and testing (such as JTAG boundary scan testing) of the device. These dedicated external pins reduce the number of pins available for user I/O. The performance of the chip may be detrimentally affected since not as many user I/O signals may be transferred in parallel.

Consequently, there is a need for techniques of effectively providing greater number of external pins for input and output to obtain higher performance. Specifically, there is a need for techniques to reduce the number of external pins dedicated to functions other than user I/O, which would make a greater number of external pins available for the input and output of user data.

SUMMARY OF THE INVENTION

The present invention is a technique to provide higher system performance by increasing the amount of data that may be transferred in parallel by increasing the number of external pins available for the input and output of user data (user I/O). One technique is to reduce the number of dedicated pins used for functions other than user I/O, leaving more external pins available for user I/O. The dedicated pins used to implement a function such as the JTAG boundary scan architecture may be also be used to provide other functionality, such as to select the programming modes. In a specific embodiment, a JTAG instruction code that is not already used for a JTAG boundary scan instruction may be used to replace the programming mode select pins in a programmable logic device (PLD).

In a technique of the present invention, the JTAG instruction used to replace the mode pins is shifted into a JTAG instruction register as are regular JTAG instructions. A JTAG boundary scan control logic block generates control signals to a programming mode decoder. Based on the instruction, the programming mode decoder selects the proper programming mode, and generates the appropriate programming mode signals. The programming mode signals are provided to the programming circuitry, and integrated circuit will be appropriately configured.

In a specific implementation, each single bit of the JTAG instruction code may be used to replace one programming mode select pin. In another implementation, the whole JTAG instruction code may be used to replace one mode select pin after instruction decoding. Technically, by doing this, many, or all, the mode pins can be eliminated, thus increasing the number of total available I/O pins. This concept provides advantages compared to JTAG programming and in-system programming (ISP) in such a way that a PLD device may be configured for different modes including test, scan, and programming modes.

The advantages of using JTAG instructions to replace programming the mode select pins of a programmable integrated circuit include saving device package costs and leaving space for more user I/Os. Overall, this increases the available functionality and value of the devices. There is relatively little cost to implement the circuits to implement PLD programming mode selection with JTAG circuits.

In a specific embodiment, the present invention is a method of configuring a programmable integrated circuit. An instruction is provided to a JTAG instruction register. The instruction is passed to a JTAG boundary scan control logic block. The JTAG boundary scan control logic block generates a control signal. The control signal is passed to a programming mode decoder. Based on the control signal, a programming mode signal is generated to place the programmable integrated circuit in a configuration mode.

Further, the present invention is a programmable integrated circuit including a JTAG state machine; an instruction register coupled to the JTAG state machine; a JTAG boundary scan control logic block coupled to the instruction register; and a programming mode decoder coupled to receive a mode signal from the JTAG boundary scan control logic block.

Another aspect of the present invention includes the use of JTAG circuitry resident on a programmable integrated circuit to select a programming mode of the integrated circuit. Further, the present invention includes the use of an instruction input to a JTAG instruction register, where this instruction is not used to perform a IEEE 1149.1 standard function, to place a programmable integrated circuit into a specific programming mode identified by the instruction. A still further aspect of the present invention is the use of JTAG circuits on a programmable logic device to place the programmable logic device in a configuration mode.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
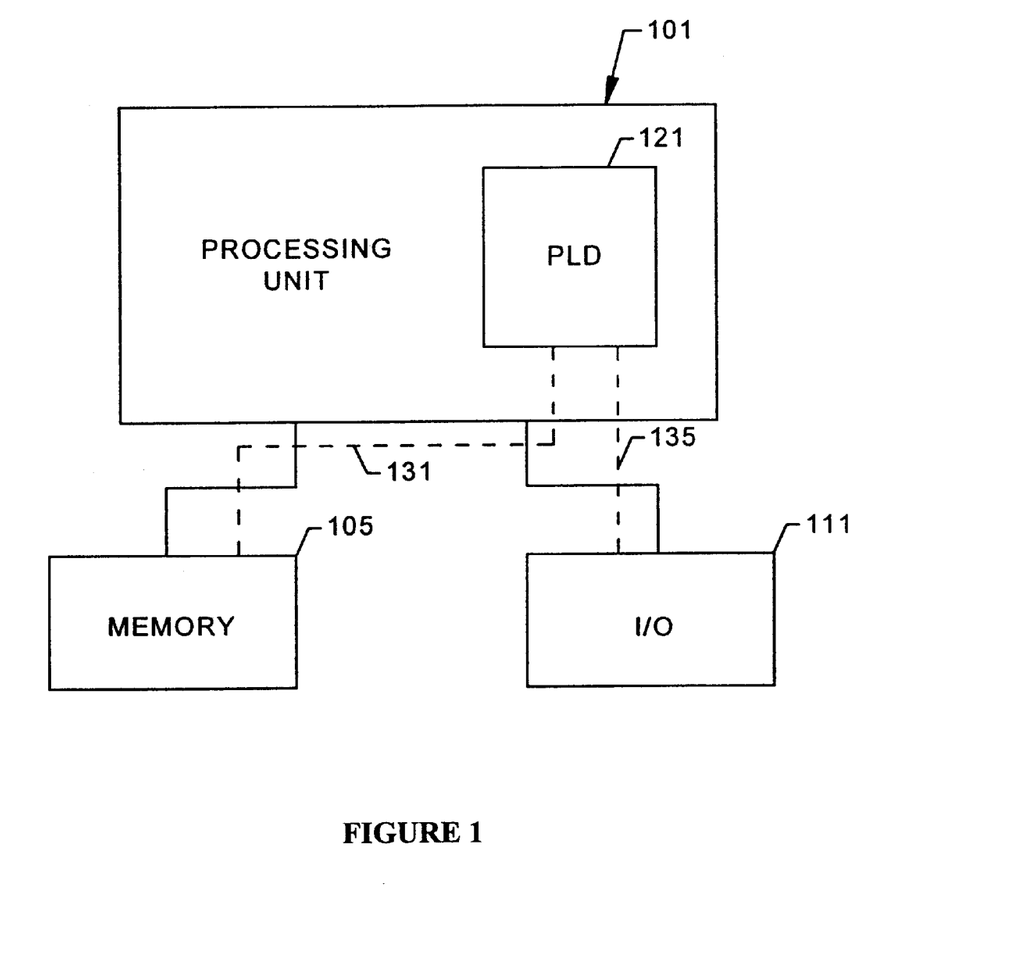
FIG. 1 shows a digital system incorporating a programmable logic device.

FIG. 1 shows a block diagram of a digital system. The system may be provided on a single board, on multiple boards, or even within multiple enclosures linked by electrical conductors or a network (e.g., a local area network or the internet). This digital system may be used in a wide variety of applications and industries including networking, telecommunications, automotive, control systems, consumer electronics, computers, workstations, military, industrial, digital processing, and many others. In the embodiment of FIG. 1, a processing unit 101 is coupled to a memory 105 and an I/O 111. Further, a programmable logic device (PLD) 121 is incorporated within this digital system. PLD 121 may be specially coupled to memory 105 through connection 131 and to I/O 111 through connection 135.

Programmable logic devices (PLDs) are sometimes also referred to as PALs, PLAs, FPLAS, CPLDs, EPLDs, EEPLDs, LCAs, or FPGAs. PLDs are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® and FLEX® series of devices. The former are described in, for example, U.S. Pat. Nos. 5,241,224 and 4,871,930, and the *Altera Data Book,* June 1996, all incorporated herein by reference in their entirety for all purposes. The latter are described in, for example, U.S. Pat. Nos. 5,258,668, 5,260,610, 5,260,611, and 5,436,575, and the *Altera Data Book,* June 1996, all incorporated herein by reference in their entirety for all purposes.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed or configured to implement the logical functions necessary to carry on its particular role in system operation.

In a PLD, the number of available external pins limits the amount of data that may be input and output of the PLD at the same time. The number of available external pins depends in part on the size and configuration of the package selected. Although larger package sizes provide greater numbers of external pins, it may not be desirable to use a larger package size since it will be more expensive, use more board space, and may have increased parasitics. Therefore, it is important to maximally use the available external pins for a given package.

On a typical PLD, some pins are dedicated for a particular purpose and other pins (i.e., I/O pins) are for input and output of logical data. For example, dedicated pins may be for testing or configuring the PLD. I/O pins are used to input and output user data. Dedicated pins cannot generally be used for user I/O. Therefore, the number of dedicated pins reduces the pins available for user I/O. Saving even a single dedicated pin, and using this pin instead for user I/O, may provide a great cost savings. For example, saving a single dedicated pin may avoid the use of the next larger package size.

In a PLD, there are typically dedicated pins for configuration and for testing. Configuration signals (e.g., pattern information) are input via a first set of dedicated pins. Test instructions and data (e.g., JTAG information) are input via a second set of dedicated pins. A technique to reduce the number of dedicated pins is to share the dedicated pins used for configuration and testing. The same amount of functionality would then be obtained using fewer dedicated pins This would increase the available number pins for user I/O. Although described with respect to PLDs, the techniques of the present invention are also applicable to other types of integrated circuits such as ASICs, microprocessors, and memories where it is desirable to reduce the number of dedicated pins and instead use these pins for user I/O.

Figure 2:
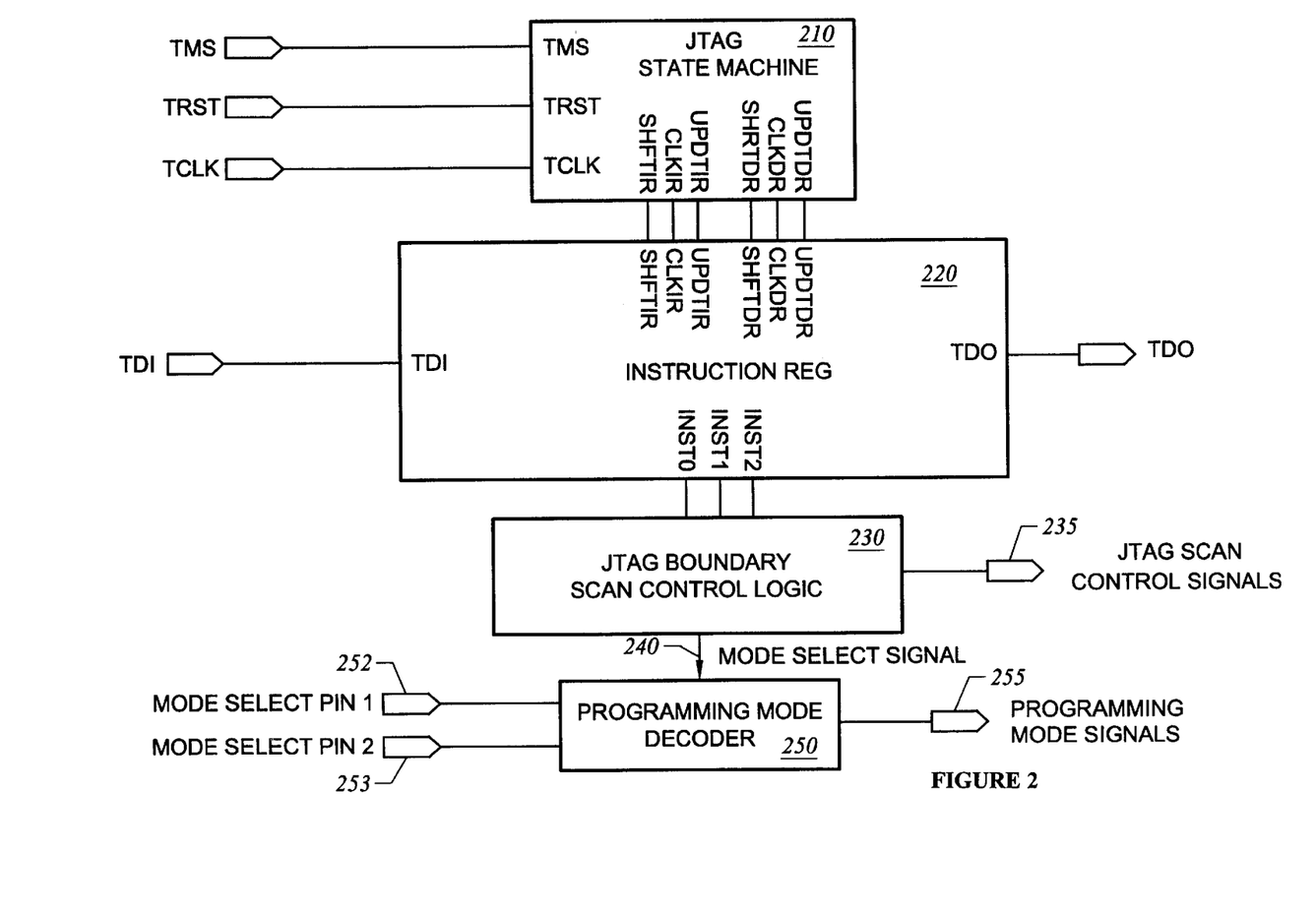
FIG. 2 shows an implementation of programming mode selection using JTAG circuitry.

FIG. 2 shows a specific embodiment of the present invention. FIG. 2 shows a block diagram of JTAG circuitry and programming mode selection circuitry. JTAG circuitry is discussed in some detail in Altera's Application Note 39, "IEEE 1149.1 (JTAG) Boundary-Scan Testing in Altera Devices," November 1995, incorporated herein by reference. In brief, the JTAG circuitry implements the IEEE 1149.1 specification or boundary-scan testing architecture. The JTAG circuitry can test pin connections without using physical test probes and can capture functional data while a device is operating normally.

The circuitry has JTAG dedicated pins TMS, TRST, TCLK, TDI, and TDO. Note that TRST pin may not be present in some embodiments. The TMS, TRST, and TCLK pins are coupled to a JTAG state machine 210. JTAG state machine 210 is a state machine providing output signals SHFTIR, CLKIR, UPDTIR, SHFTDR, CLKDR, and UPDTDR based on the TMS, TRST, TCLK inputs. JTAG state machine 210 controls the sequential operation of the circuitry.

TDI is a serial input to an instruction register 220, and TDO is a serial output. JTAG state machine 210 controls the serially shifting of an instruction from TDI into instruction register 220. The instruction may be serially shifted out through TDO. Further, the instruction may also be output in parallel via INST0, INST1, and INST2 lines. In the JTAG circuitry, there are also data registers (such as a boundary-scan register) that are not explicitly shown in FIG. 2. A description of the JTAG data registers may be found in Application Note 39.

The instruction is coupled to a JTAG boundary control scan control logic 230 via parallel INST0, INST1, and INST2 lines. JTAG boundary scan control logic 230 generates JTAG scan control signal 235. JTAG scan control signals 235 are routed to the appropriate JTAG circuitry to control JTAG operation. Further, JTAG boundary scan control logic 230 also generates a mode select signal 240 provided to a programming mode decoder 250. Programming mode decoder also has inputs from mode select pin 1 (252) and mode select pin 2 (253), and generates programming mode signals 255.

Figure 3:
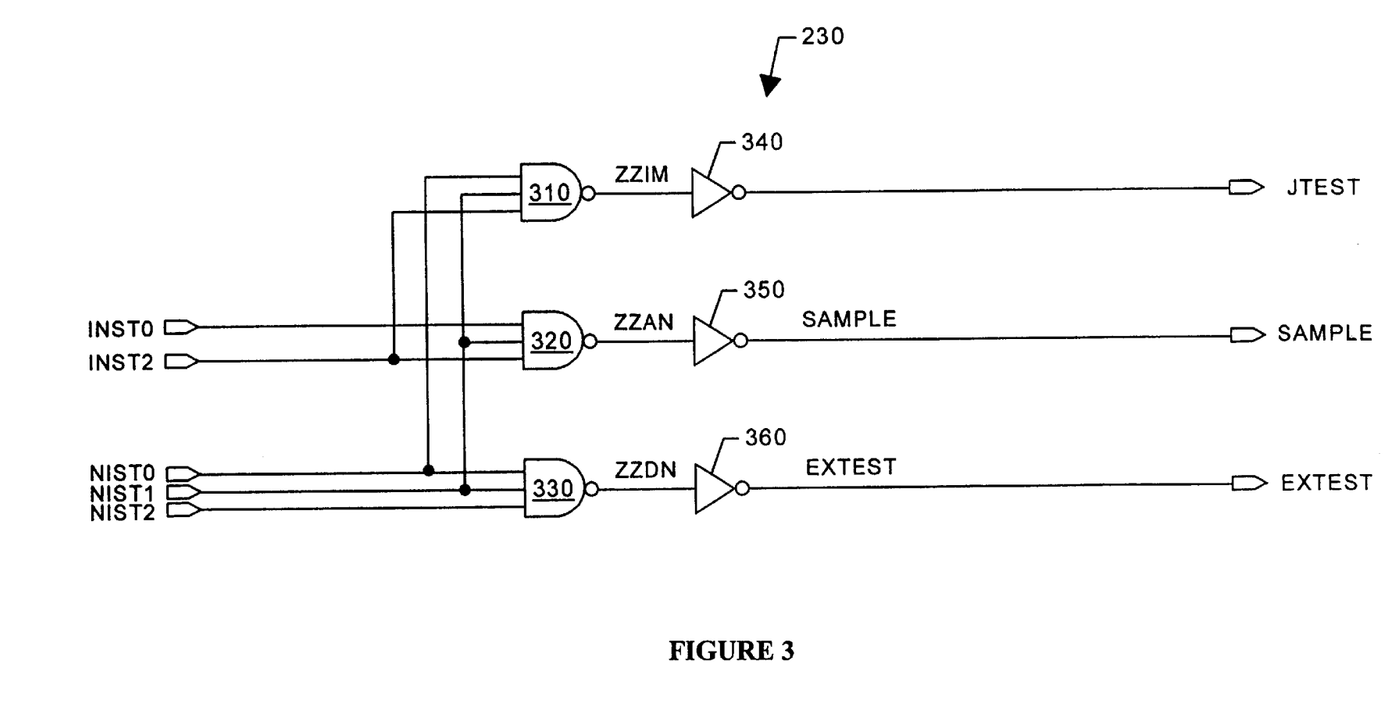
FIG. 3 shows an implementation of JTAG boundary scan control logic circuitry.

FIG. 3 shows a specific implementation of circuitry within JTAG boundary scan control logic 230. The input signals are INST0, INST2, NINST0, NINST1, and NINST2. NINST0, NINST1, and NINST2 are the complements of INST0, INST1, and INST2, respectively. For example, NINST0, NINST1, and NINST2 may be obtained by inverting the INST0, INST1, and INST2 using inverters. Output signals are JTEST, SAMPLE, and EXTEXT.

The circuitry includes NAND gates 310, 320, and 330. NAND gate 310 has as inputs NINST0, NINST1, and INST2. NAND 310 couples to an inverter 340 to output JTEST. NAND gate 320 has as inputs INST0, NINST1, and INST2. NAND 320 couples to an inverter 350 to output SAMPLE. NAND gate 330 has as inputs NINST0, NINST1, and NINST2. NAND 330 couples to an inverter 360 to output EXTEST.

The JTAG boundary scan control logic 230 circuitry determines which mode the PLD will be in based on the instruction input by the user. In this embodiment, the instruction has three bits, INST0, INST1, and INST2. In other embodiments, there may be more or less than three bits depending on the desired number of different instructions. For example, in some embodiments, the instruction has ten bits. With three bits, up to eight different instructions can be implemented. With ten bits, up to $2^{10}$ different instructions can be implemented.

The circuitry in FIG. 3 decodes the instructions as follows. A "001" indicates a JTEST mode (where INST0 is 0, INST1 is 0, and INST2 is 1). A "101" indicates a SAMPLE mode. A "001" indicates an EXTEST mode. SAMPLE and EXTEST are JTAG modes. JTEST is a configuration or programming mode. Therefore, by using the same dedicated pins are used to input JTAG instructions, a programming mode may also be indicated. This means a separate dedicated pin to indicate a programming mode is not needed, thus saving a dedicate pin which may be used instead for user I/O. Furthermore, there may be other JTAG modes (not shown in FIG. 3) such as BYPASS which is typically indicated by a "111" instruction.

In the SAMPLE and EXTEXT modes, the corresponding SAMPLE and EXTEXT signals will be logic high. And, in the JTEST mode, the JTEST signal will be a logic high. SAMPLE and EXTEXT are examples of JTAG control signals 235. JTEST is an example of mode select signal 240.

Figure 4:
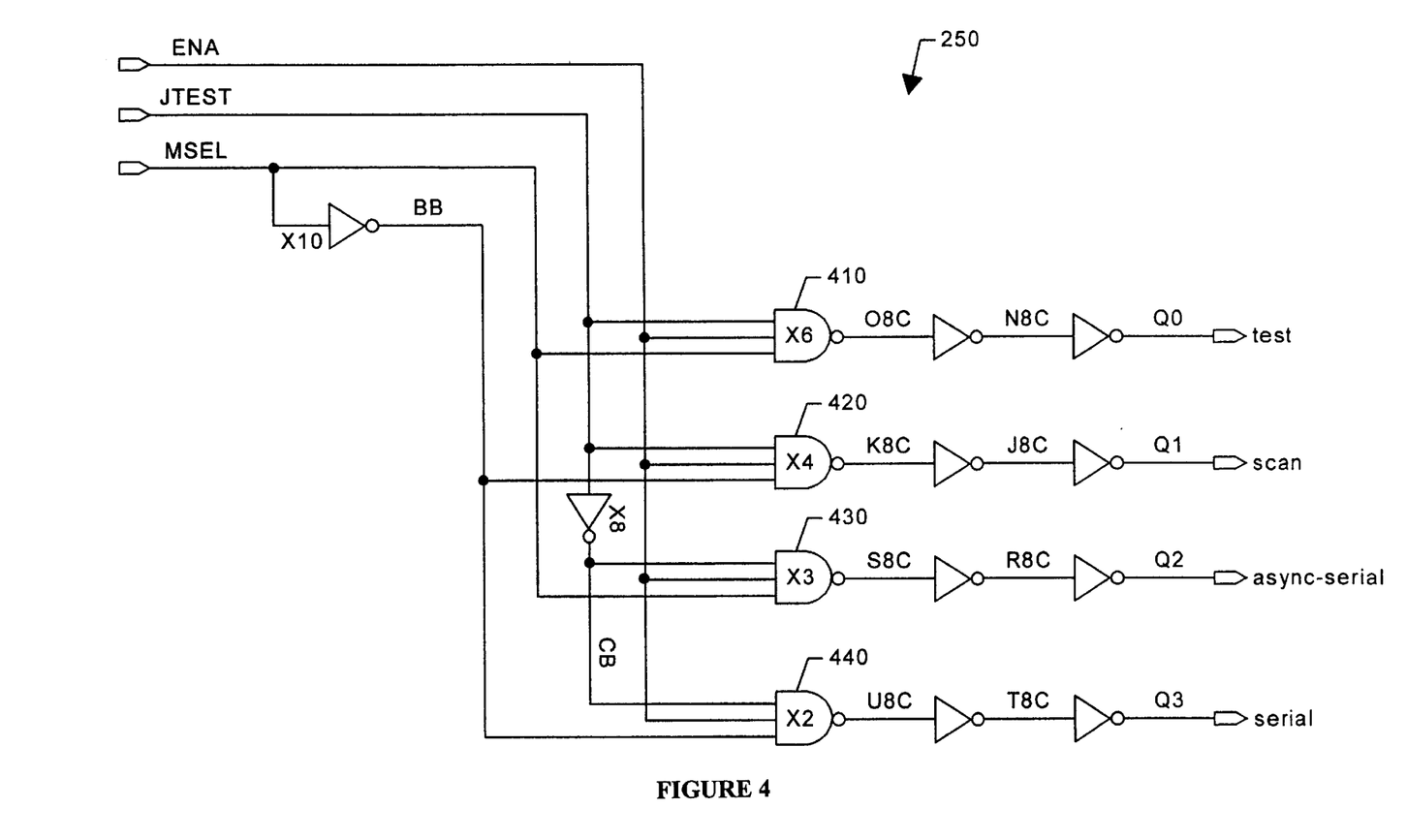
FIG. 4 shows an implementation of a programming mode decoder.

FIG. 4 shows circuitry for programming mode decoder 250. Inputs are ENA, JTEST, and MSEL. ENA is an enable signal to enable decoder 250. JTEST is generated by JTAG boundary scan control logic 230 (such as the circuitry shown in FIG. 3). MSEL is representative of mode select a pins 252 and 253. However, the implementation FIG. 4 only shows one mode select pin in order to illustrate the principles of the present invention. In practice, there may be as many or as few mode select pins as desired to obtain the number of desired modes.

Outputs of decoder 250 are TEST, SCAN, ASYNC-SERIAL, and SERIAL. These signals are routed to the appropriate programming circuitry to configure the PLD. The programming circuitry may generate high voltages such as those used in the programming of Flash, EEPROM, EPROM, and other nonvolatile memory cells. The programming circuitry may also be used to configure other types of memory cells such as SRAM and DRAM cells.

The circuitry includes NAND gates 410, 420, 430, and 440. NAND gate 410 has inputs JTEST, ENA, and MSEL. NAND gate 410 outputs through a pair of serially coupled inverters to generate TEST. NAND gate 420 has inputs JTEST, ENA, and BB (i.e., complement of MSEL). NAND gate 420 outputs through a pair of serially coupled inverters to generate SCAN. NAND gate 430 has inputs CB (i.e., complement of JTEST), ENA, and MSEL. NAND gate 430 outputs through a pair of serially coupled inverters to generate ASYNC-SERIAL. NAND gate 440 has inputs CB, ENA, and BB. NAND gate 440 outputs through a pair of serially coupled inverters to generate SERIAL.

In operation, a "test" programming mode is entered when ENA is high, JTEST is high, and MSEL is high. A "scan" programming mode is entered when ENA is high, JTEST is high, and MSEL is low. An "async-serial" programming mode is entered when ENA is high, JTEST is low, and MSEL is high. A "serial" mode is entered when ENA is high, JTEST is low, and MSEL is low.

In practice, there are many implementations of the boundary scan control logic circuitry 230 and programming mode decoder 250 shown in FIGS. 3 and 4. Other implementations may use other selections for the decoding and other logical structures including AND and OR gates or look-up tables, to name a few examples.

For example, other specific instructions may be used to indicate a programming mode. Standard JTAG instructions are identified by 101, 000, and 111. Consequently, a programming mode control signal may be implemented by using an instruction not already used by JTAG. The available instructions are 001, 010, 011, 100, and 110. In FIG. 3, the choice of the specific instruction to indicate the JTEST programming mode was 001. However, any of the other available instructions could have been selected, and the appropriate changes made to the circuitry.

Furthermore, FIG. 3 only shows a single JTEST programming mode; however, circuitry may provide for more than one programming mode signal. With a 3-bit instruction, there can be up to five programming mode instructions. The circuitry can be modified to provide more than one programming mode instruction, and thus save greater numbers of dedicated mode select pins.

The circuitry shown in FIGS. 3 and 4 illustrates (by way of an specific example) a technique to eliminate one mode select pin by implementing a JTEST instruction. The JTEST instruction is recognized by the JTAG circuitry to indicate a programming mode. Using the JTEST signal, programming mode decoder 250 provides four modes, taking as input only one dedicated mode select pin. Without the JTEST instruction, two dedicated mode select pins would have been required to have four different programming modes. The JTEST instruction saves one mode select pin. Therefore, using the technique of the present invention, fewer dedicated pins are required to implement the programming modes, leaving more external pins for user I/O.

In further embodiments of the present invention, dedicated pins to indicate the programming modes may be eliminated altogether. In that case, the programming modes would be determined entirely by the instruction in instruction register 220. And there may be multiple JTEST signals. For example, an instruction may be decoded to provide JTEST1, JTEST2, and JTEST3 signals used to distinguish between up to eight programming modes. As discussed above, the number of available programming modes depends on the number of available instructions not being used to implement JTAG modes.

The techniques and circuitry of the present invention are also applicable for in-system programming (ISP) of a PLD, where the PLD is programmed while resident on a printed circuit board.

Figure 5:
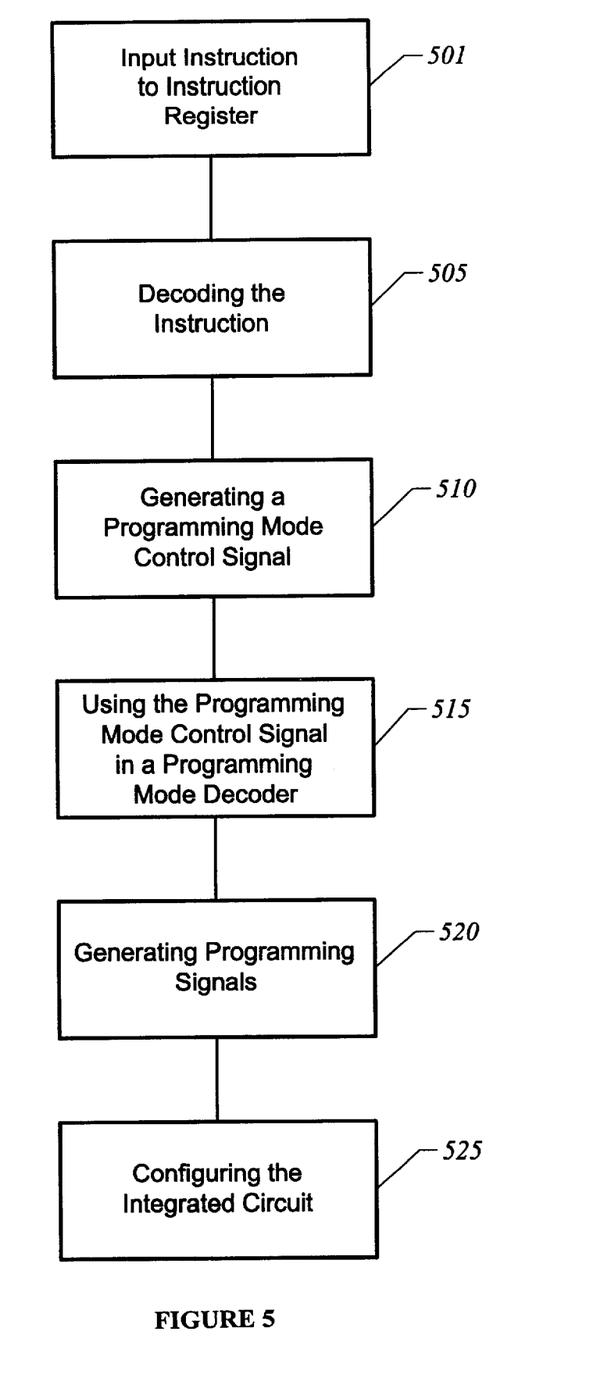
FIG. 5 shows a flow diagram of a technique for configuring an integrated circuit.

FIG. 5 shows a flow diagram of a technique of the present invention. The technique of the present invention permits the programming or configuration of an integrated circuit using the JTAG circuitry. In a step 501, an instruction is input into JTAG instruction register 220 of the integrated circuit. The instruction may be serially shifted in via the TDI pin according to the control signals from JTAG state machine 210. In a specific embodiment, the instruction may have three bits INST0, INST1, and INST2.

In a step 505, the instruction in the instruction register is decoded. The instruction is passed in parallel to JTAG boundary scan control logic 220. JTAG boundary scan control logic 220 generates the appropriate control signal to indicate a JTAG mode or a programming mode. For example, SAMPLE and EXTEST are JTAG modes, and JTEST is a programming mode.

In a step 510, the JTEST signal is generated by JTAG boundary scan control logic 220 to indicate a programming mode. The JTEST signal may be implemented using an available instruction which is not used as a JTAG instruction.

In a step 515, the JTEST signal is passed to programming mode decoder 250. In a step 520, using the JTEST signal, the programming mode decoder 250 generates programming mode signals 255 (such as TEST, SCAN, ASYNC-SERIAL, and SERIAL) that are passed to the programming circuitry.

Based on programming mode signals 255, the integrated circuit will be configured by the programming circuitry. The configuration of the integrated circuit may be in an in-system programming (ISP) mode.

The present invention may be used in conjunction and is compatible with other techniques to effectively increase the available number of user I/O pins, such as described in U.S. patent application Ser. No. 09/094,226, filed Jun. 9, 1998, now U.S. Pat. No. 6,314,550, which is incorporated by reference.

Another technique to increase the number of pins is to permit the use of the JTAG pins for user I/O when JTAG is not used by the user. To implement the JTAG standard in an integrated circuit, the integrated circuit needs at least four pins: TCLK, TMS, TDIN, and TDO. These are dedicated pins for accessing JTAG functionality. However, for customers who do not use JTAG, these pins are not used. The technique of the present invention allows these customers to use the JTAG pins as regular I/O pins. The technique of the present invention is especially useful for programmable logic devices (PLDs), field programmable gate arrays (FPGAs), and many other types of integrated circuits.

In the method of the present invention, the information whether JTAG operation is enabled or disabled is encoded in an option register bit. After power up of the integrated circuit, the default state of option register allows these four pins to be used as JTAG pins. Thus, JTAG operation is enabled. After the option register bit is programmed, there are two cases.

(1) The customer may choose to use JTAG, and the option register is configured to reflect this. Then, these four pins will continue to function as JTAG pins.

(2) In the case the customer chooses not to use JTAG, the option register is configured to reflect this. The four JTAG pins will be disconnected from the JTAG circuitry. JTAG operation will not be enabled. After the device enters the user mode, these four pins can be used as regular I/O pins, thus avoiding the waste of these pins when JTAG is not used.

The configuration of the option register may be held using memory cells such as SRAM, EPROM, EEPROM, Flash, RAM, and many others. The configuration information may be nonvolatile.

During programming, the JTAG state machine stays in the reset state regardless the state of JTAG pins.

An advantage of the method of the present invention is to allow four more I/O pins for those customers who do not use JTAG. These customers can treat the four pins as regular I/O pins during both programming and user mode. Further, there is no "difficult to use" problem.

Figure 6:
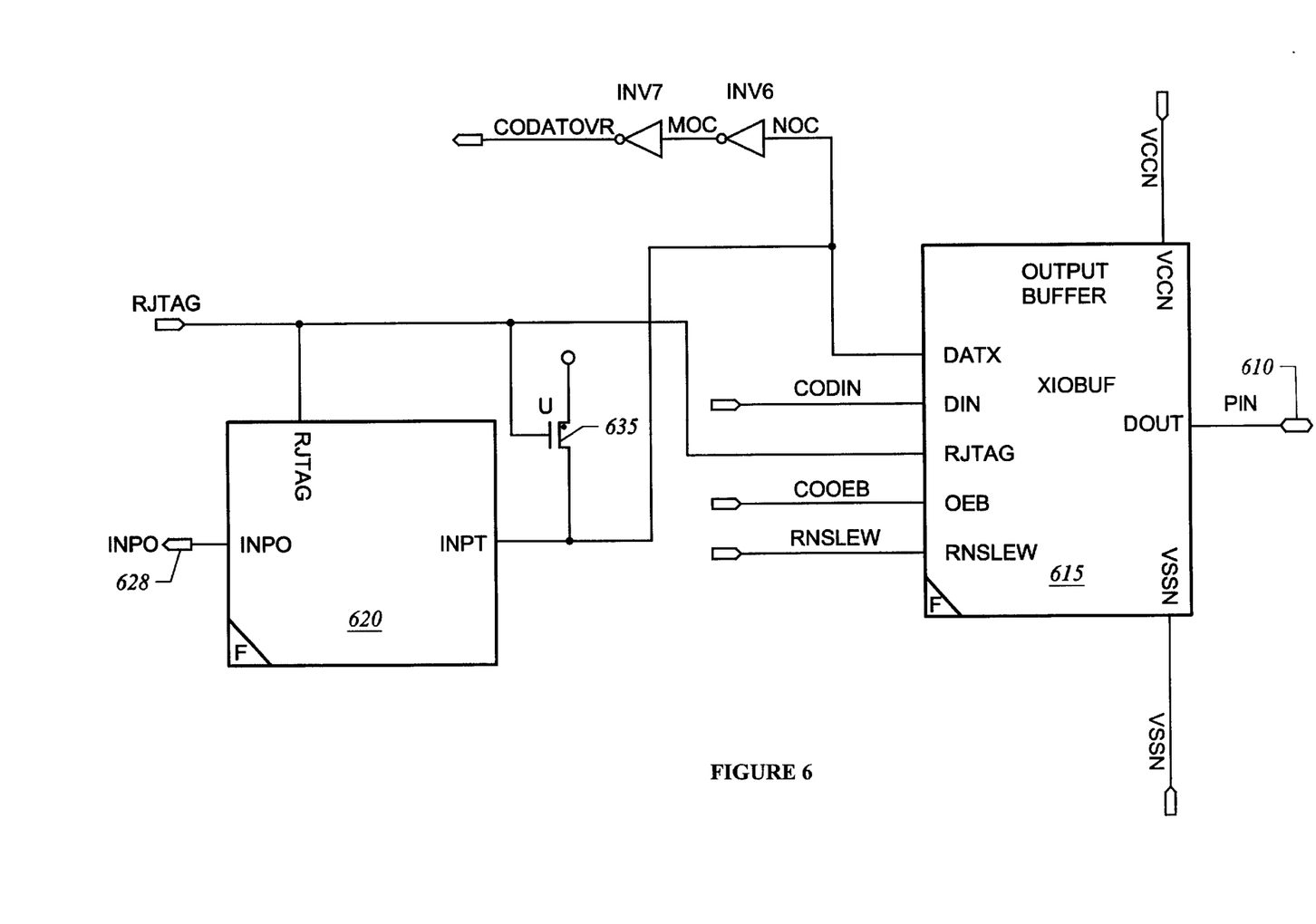
FIG. 6 shows circuitry for selectably enabling use of a JTAG input pin.
Figure 7:
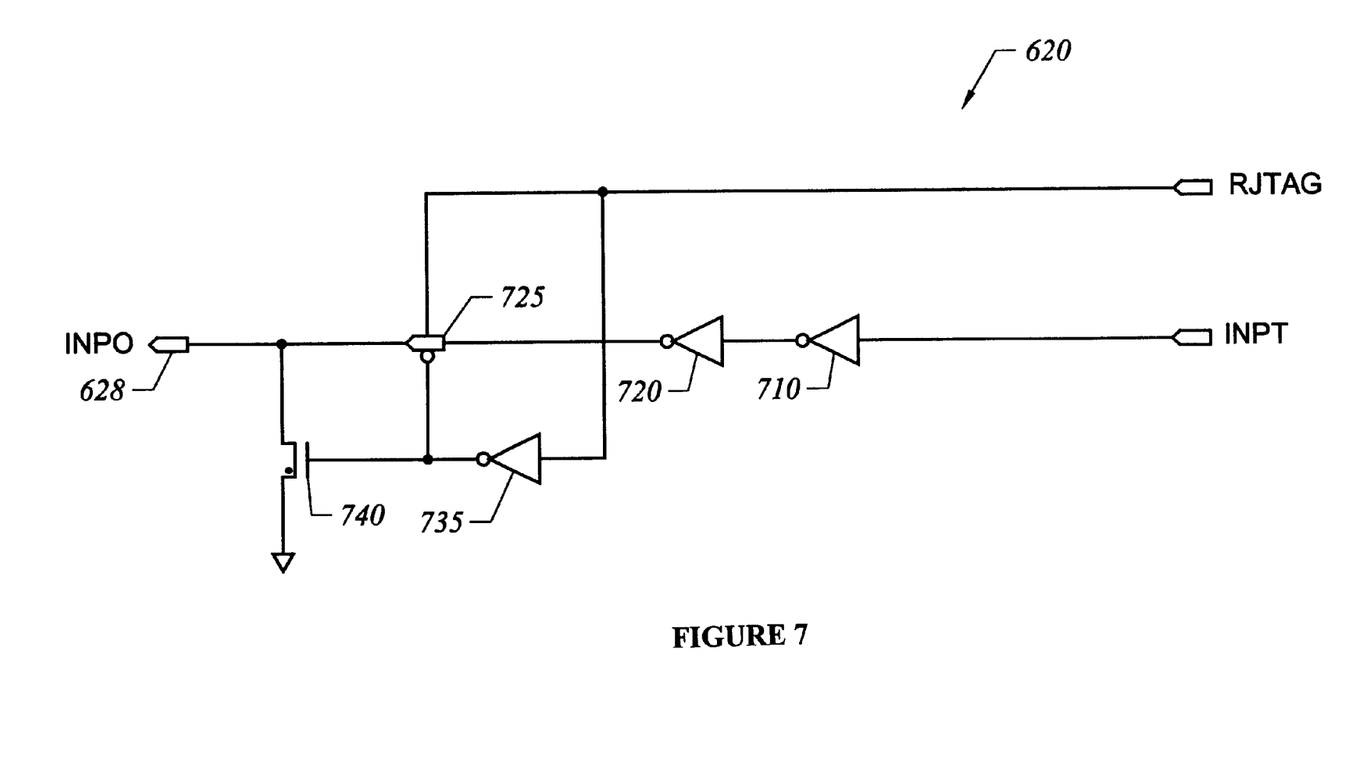
FIG. 7 shows a circuit implementation of a JTAG input buffer.
Figure 8:
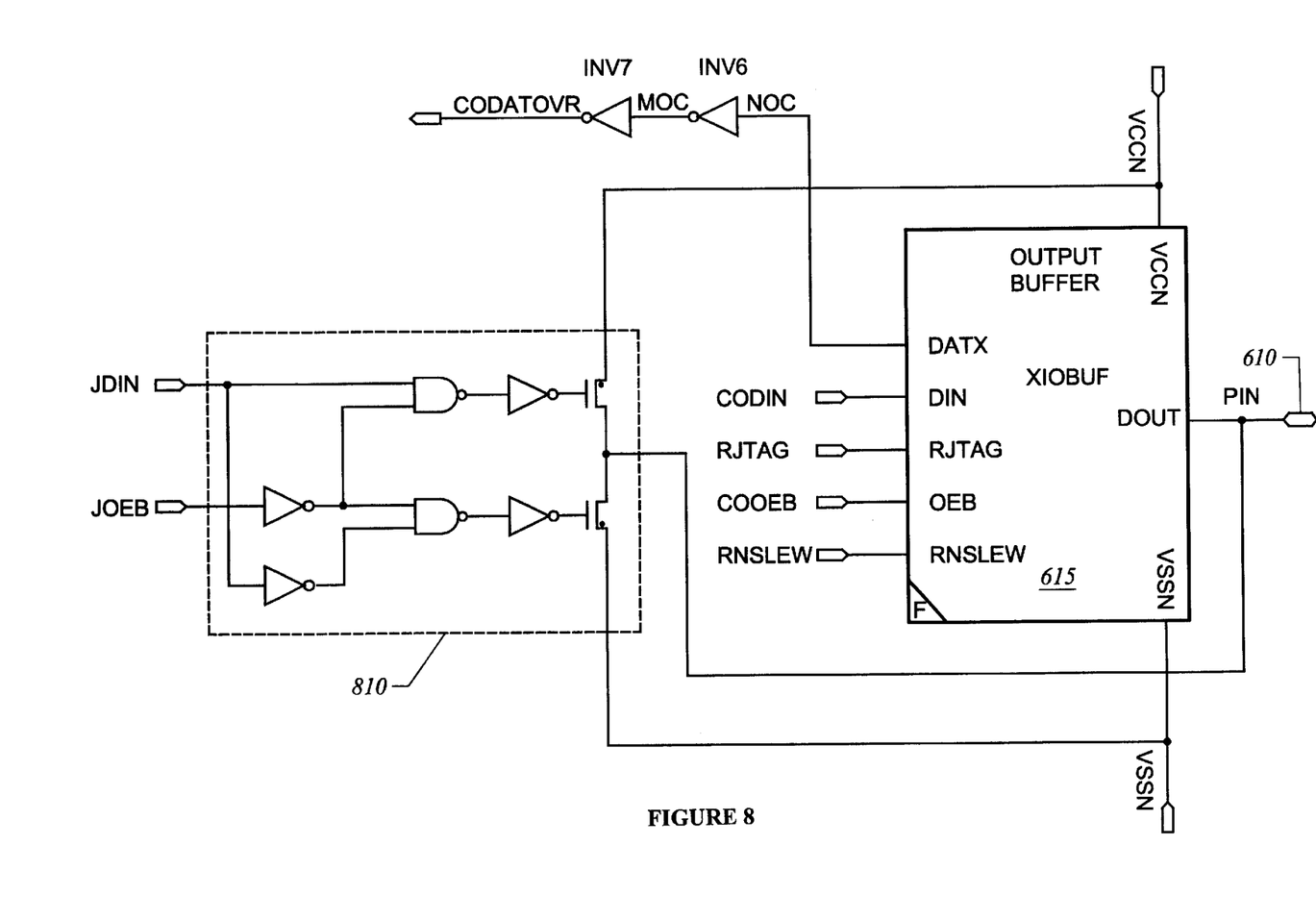
FIG. 8 shows a circuit implementation for selectably enabling use of a JTAG output pin.

FIGS. 6, 7, and 8 show a circuit implementation for an integrated circuit with configurably or selectably enabled and disabled JTAG pins.

FIG. 6 shows circuitry which may be used for the TDI, TCLK, and TMS input pins. Pin 610 is the I/O pin of the integrated circuit, and is coupled to an output buffer 615. Output buffer 615 has transistor drivers coupled to a noisy positive supply VCCN and noisy ground supply VSSN. VCCN and VSSN are distinguished from quiet positive and ground supplies VCCQ and VSSQ, respectively. Some degree of isolation is achieved by separating the quiet and noisy supplies. However, in some implementations, there may be only VCC and VSS supply pins, where there are not separate noisy and quiet supplies.

Output buffer 615 is a data output buffer for drive data to pin 610. Output data is input at a DIN input. An OEB input controls whether pin 610 is tristated. A RNSLEW input controls whether the slew rate at the drivers of the output buffer are slowed in order to minimize or prevent ground or power bounce. A DATX output passes data from pin 610 to an input buffer for the integrated circuit. The input buffer includes inverters INV7 and INV6. An output of INV6 drives the internal circuitry.

An RJTAG input to the circuitry determines whether JTAG functionality is enabled or disabled. A JTAG input buffer is represented by block, the details of which are shown in FIG. 7. The JTAG input buffer includes inverters 710 and 720 and a transmission gate 725. An input of inverter 710 is coupled to DATX (see FIG. 6). A control electrode of an NMOS transistor of transmission gate 725 is coupled to RJTAG. A control electrode of a PMOS transistor of transmission gate 725 is coupled through an inverter 725 to RJTAG. An output of inverter 726 is also coupled to a gate of an NMOS transistor 740, which is coupled between an output 628 of the JTAG input buffer and ground.

When RJTAG is a logic high, the JTAG input buffer 620 is enabled to pass data to the internal JTAG circuitry and JTAG functionality is permitted.

When RJTAG is a logic low, JTAG functionality if disabled. This is occurs by disabling the JTAG input buffer. Transmission gate 725 is turned off, decoupling an output of inverter 720 from output 628 of the JTAG input buffer. Transistor 740 is turned on in order to ground output 628. A PMOS transistor 635 is turned on in order to couple VCC to the input of the JTAG input buffer 620, ensuring the input is a logic high. Then, inverters 720 and 710 will be in a known state, and not consume unnecessary power. RJTAG will control the output buffer 615 to function as a user I/O pin.

FIG. 8 shows circuitry which may be used for a TDO output pin. Depending on the states of RJTAG and JOEB, the JTAG functionality may be disabled. The input buffer (i.e., INV6 and INV7) and output buffer 615 are as described above. A circuit block is a JTAG output buffer 810 for outputting JTAG data. This JTAG data is input to the JTAG output buffer through the JDIN pin. An output of the JTAG output buffer 810 is coupled to pin 610.

When RJTAG is logic high and JOEB is logic low, JTAG functionality will be enabled. When RJTAG is logic low and JOEB is logic high, JTAG functionality will be disabled. Specifically, the JTAG output buffer will be tristated, and output buffer 615 will function similarly as for a user I/O pin.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. A method of configuring a programmable integrated circuit comprising:

providing an instruction to a JTAG instruction register;

passing the instruction to a JTAG boundary scan control logic block wherein the JTAG boundary scan control logic generates JTAG scan control signals;

generating in the JTAG boundary scan control logic block a control signal;

passing the control signal to a programming mode decoder; and based on the control signal, generating a programming mode signal to place the programmable integrated circuit in a configuration mode.

2. The method of claim 1 wherein the instruction is not an IEEE 1149.1 JTAG instruction.

3. The method of claim 1 wherein the instruction is shifted serially into the JTAG instruction register.

4. The method of claim 1 wherein the instruction is passed in parallel to the JTAG boundary scan control logic block.

5. The method of claim 1 wherein the control signal is not a JTAG scan control signal.

6. The method of claim 1 further comprising:

in the configuration mode, loading configuration information into the programmable integrated circuit through non-JTAG external pins.

7. The method of claim 1 further comprising:

configuring programmable memory cells of the programmable integrated circuit in the configuration mode.

8. The method of claim 7 wherein the programmable memory cells are EEPROM or Flash cells.

9. The method of claim 7 wherein the programmable memory cells are SRAM cells.

10. The method of claim 1 wherein the programming mode decoder comprises:

a plurality of logic gates, each having an input coupled to the control signal and at least two inputs coupled to mode select signals, and providing four separate programming mode signals.

11. A method of configuring a programmable integrated circuit comprising:

storing in a JTAG instruction register an instruction indicating the programmable integrated circuit is to be configured;

placing the programmable integrated circuit in a configuration mode based on the instruction stored in the JTAG instruction register; and configuring programmable memory cells of the programmable integrated circuit in the configuration mode.

12. The method of claim 11 further comprising:

decoding the instruction using a JTAG boundary scan control logic block; and determining the instruction is not a JTAG scan control signal.

13. The method of claim 11 wherein configuring the programmable integrated circuit comprises imprinting the programmable integrated circuit with a desired pattern.

14. The method of claim 11 further comprising:

in the configuration mode, selecting a configuration mode operation based on the instruction stored in the JTAG instruction register and a mode select pin.

15. The method of claim 11 wherein the programmable memory cells are EEPROM or Flash cells.

16. The method of claim 11 wherein the programmable memory cells are SRAM cells.

17. A method of operating a programmable logic device comprising:

serially inputting an instruction to an instruction register of the programmable logic device;

decoding the instruction in a control logic block;

when the instruction is an IEEE 1149.1 JTAG instruction, performing IEEE 1149.1 JTAG operations in the programmable logic device;

when the instruction is a configuration instruction, generating a control signal in the control logic block;

in response to the control signal, generating a programming mode signal to place the programmable logic device into a configuration mode.

18. The method of claim 17 further comprising:

when in the configuration mode, permitting a user to configure the programmable logic device.

19. The method of claim 17 wherein the configuration instruction is not a IEEE 1149.1 standard JTAG instruction.

20. The method of claim 17 further comprising:

when the instruction is not the configuration instruction, not placing the programmable logic device in the configuration mode.

21. The method of claim 17 further comprising:

when in the configuration mode, permitting a user to select from a plurality of different modes within the configuration mode.

22. The method of claim 21 wherein the user's selection of one of the plurality of different modes is input by way of parallel instruction bits provided to the programmable logic device.

23. A technique of programming a programmable logic device while it is resident on a system board comprising the method recited in claim 17.

24. The method of claim 17 wherein the JTAG instruction comprises a plurality of bits clocked into the programmable logic device.

25. The method of claim 17 wherein the control logic block comprises a plurality of NAND gates, each coupled to the instruction register.

26. The method of claim 17 further comprising:
configuring programmable memory cells of the programmable integrated circuit in the configuration mode.

27. The method of claim 26 wherein the programmable memory cells are EEPROM or Flash cells.

28. A method of placing a programmable logic integrated circuit into its configuration mode to program memory cells of the programmable logic integrated circuit comprising inputting a configuration instruction into a register of the programmable logic integrated circuit, wherein the register is also used for IEEE 1149.1 JTAG operations when IEEE 1149.1 JTAG instructions are input into the register.

29. The method of claim 28 wherein the memory cells are EEPROM or Flash cells.

* * * * *